(12) United States Patent
Capstick

(10) Patent No.: US 12,506,470 B2
(45) Date of Patent: Dec. 23, 2025

(54) DIFFERENTIAL CURRENT BUFFER CIRCUIT AND DC AND ALTERNATING CURRENT SOURCE COMPRISING THE SAME

(71) Applicant: IT'IS FOUNDATION, Zürich (CH)

(72) Inventor: Myles Capstick, Zürich (CH)

(73) Assignee: IT'IS FOUNDATION, Zürich (CH)

( * ) Notice: Subject to any disclaimer, the term of this patent is extended or adjusted under 35 U.S.C. 154(b) by 0 days.

(21) Appl. No.: 18/858,250

(22) PCT Filed: Mar. 21, 2023

(86) PCT No.: PCT/EP2023/057158
§ 371 (c)(1),
(2) Date: Oct. 18, 2024

(87) PCT Pub. No.: WO2023/202829
PCT Pub. Date: Oct. 26, 2023

(65) Prior Publication Data
US 2025/0175167 A1  May 29, 2025

(30) Foreign Application Priority Data
Apr. 20, 2022 (DE) ............ 10 2022 109 563.0

(51) Int. Cl.
*H03K 5/02* (2006.01)
*H03F 3/45* (2006.01)

(52) U.S. Cl.
CPC ........... *H03K 5/02* (2013.01); *H03F 3/45076* (2013.01)

(58) Field of Classification Search
CPC ....... H03F 3/45475; H03F 2203/45182; H03F 2203/45136; H03F 2203/45134; H03F 2200/91; H03F 2200/516; H03F 2200/498
See application file for complete search history.

(56) References Cited

U.S. PATENT DOCUMENTS 9,819,309 B2 * 11/2017 Wilson .................. H03F 1/0205
2004/0056043 A1 * 3/2004 Griesbach, III ....... A61B 50/30
221/303

(Continued)

FOREIGN PATENT DOCUMENTS

KR        20030053493 A      6/2003

OTHER PUBLICATIONS

A. Payne et al., "Differential Current Input Cell With Common Mode Feedback", Electronic Letters, vol. 26, No. 20, Sep. 27, 1990, 2 pages.

(Continued)

*Primary Examiner* — Quan Tra
(74) *Attorney, Agent, or Firm* — NIXON & VANDERHYE

(57) ABSTRACT

A differential current buffer circuit comprises a differential input stage supplied from a first positive and a first negative supply voltage. The input stage has a first input circuit connected between first current paths of a first current and a second mirror connected between second positive and negative supply voltages. A second input circuit is connected between first current paths of a third and a fourth current mirror connected between the second positive and negative supply voltages. The second positive voltage is higher than the first positive supply voltage, and the second negative voltage is lower than the first negative supply voltage. A first and a second output of the differential current buffer circuit are tapped off between the respective second current paths of the first and second current mirrors and the respective second current paths of the third and fourth current mirrors, respectively.

9 Claims, 7 Drawing Sheets

(56) References Cited

U.S. PATENT DOCUMENTS

| | | | | |
|---|---|---|---|---|
| 2005/0206452 A1* | 9/2005 | Lehto | ............ | H03F 3/45484 |
| | | | | 330/257 |
| 2009/0153247 A1* | 6/2009 | Sutardja | ............ | H03F 1/086 |
| | | | | 330/259 |
| 2015/0077183 A1* | 3/2015 | Ciubotaru | ............ | H03G 1/0029 |
| | | | | 330/254 |
| 2022/0200554 A1* | 6/2022 | Clara | ............ | H03F 1/303 |

OTHER PUBLICATIONS

Rajesh H. Zele et al., "Fully-Differential CMOS Current-Mode Circuits", Proceedings of the Custom Integrated Circuits Conference, May 12, 1991, 5 pages.

Miling Gajare et al., "CMOS Transimpedance Feedback Amplifier Design using Unity Gain Differential Amplifiers", 2021 International Conference on Emerging Smart Computing and Informatics (ESCI), Mar. 5, 2021, 5 pages.

Jim Karki, "Fully differential amplifiers", Analog Applications Journal, Aug. 1, 2000, 5 pages, retrieved from the Internet: https://www.ti.com/sc/docs/apps/msp/jo urnal/aug2000/aug_08.pdf.

International Search Report for PCT/EP2023/057158, mailed Jul. 4, 2023, 4 pages.

Written Opinion of the ISA for PCT/EP2023/057158, mailed Jul. 4, 2023, 7 pages.

Franco, "Limitations of two-port analysis of negative feedback circuits", May 3, 2018, URL: https://www.edn.com/limitations-of-two-port-analysis-ofnegative-feedback-circuits, [accessed Mar. 10, 2023], pp. 1-13.

Office Action, issued in German Patent Application No. 102022109563.0 dated Mar. 15, 2023.

Texas Instruments, "A Comprehensive Study of the Howland Current Source," Application Report, SNOA474A, Jan. 2008—Revised Apr. 2013, pp. 1-17.

Texas Instruments, "Analysis of Improved Howland Current Pump Configurations" Application Report, SBOA437, Oct. 2020, pp. 1-11.

Office Action, issued in Korean Patent Application No. 10-2024-7037955 dated Feb. 17, 2025.

* cited by examiner

DIFFERENTIAL CURRENT BUFFER CIRCUIT AND DC AND ALTERNATING CURRENT SOURCE COMPRISING THE SAME

CROSS-REFERENCE TO RELATED APPLICATIONS

This application is the U.S. national phase of International Application No. PCT/EP2023/057158 filed Mar. 21, 2023, which designated the U.S. and claims priority to DE 10 2022 109 563.0 filed Apr. 20, 2022, the entire contents of each of which are hereby incorporated by reference.

FIELD

The present invention relates to fully differential current source apparatuses for electrical stimulation of patients, more particularly to broadband high voltage buffer circuits for DC and alternating current sources for injecting currents over a wide range of frequencies into patient's tissue for electrical stimulation or electrical bioimpedance measurements.

BACKGROUND

Injecting or applying electrical currents to a patient's tissue has been used for several years for electrical bioimpedance measurements and electrical stimulation for investigating and treating, inter alia, muscular, and brain disorders. Using electrical currents permits to accurately control the electrical charge that is injected into the tissue, eliminating the influence of electrical resistances between the electrodes and the tissue.

Such electrical currents are applied in a wide range of frequencies and must be tightly controlled in terms of frequency, amplitude, and phase to obtain reproducible results under varying circumstances, e.g., different conductivity of a patient's skin and underlying tissues across different sessions or between different patients.

A current source design that is widely used for this purpose is the Howland current source, which is an operational amplifier in a specific feedback design. An example of a Howland current source is shown in FIG. 1a. A non-inverting input of an operational amplifier 10 is connected to a positive input of the Howland current source via a first resistor R1. The output signal of operational amplifier 10 is fed back to the non-inverting input of operational amplifier 10 via a second resistor R2. The non-inverting input of operational amplifier 10 also forms the output node $V_X$ of the Howland current source, to which a load $Z_L$ is connected. The output signal of operational amplifier 10 is also provided, via a fourth resistor R4, to an inverting input of operational amplifier 10. The inverting input of operational amplifier 10 is also connected, via a third resistor R3, to a negative input of the Howland current source. The feedback from the output to both the '+' and '−' inputs is at equal strength, i.e., the ratios of R1/R2 and R3/R4 are equal.

If the "output" node $V_X$, which is the '+' input of the op-amp, is grounded, it is easy to see that the "gain" is 1/R1, that is, the output current per change of the input voltage is equal to 1/R1. The resistors R2, R3, and R4 have no effect when the output is grounded, and only the '+' input voltage is active. When the '−' input is moved upward, the gain to the grounded output node is −R4/R3×1/R2. Since the ratio of the resistors is defined to be R1/R2=R3/R4, then that gain is also equal to −1/R1. Note that the gain is reversed for the '−' input. Thus, it is easy to see that if both Vin+ and Vin− are moved together, then there is no change of $I_{out}$, i.e., common-mode signals are rejected. When Vin+ rises, the "gain" to the output node is "1/R1". Then it follows that the gain for the '−' input is also "1/R1" but with a negative sign. So, this current pump can accept positive or negative inputs, i.e., it has true differential inputs.

As will be shown next, the output impedance is high so that the gain is correct for all output voltages and impedances and all inputs. It is easy to see that the output impedance is very high using this analysis: If both signal inputs are grounded, and if the "output" node $V_X$ is lifted up, some source is driving the resistance "R1". But as the op-amp's +input is lifted, the − input must also rise up, and the output also rises, providing just enough current through R2 to cancel the current flowing through R1, thus making the output impedance very high indeed. The principle of linear superposition says that no matter what is Vin+ or Vin−, and no matter what is $Z_L$, and no matter what is $V_{out}$, the current $I_{out}$ will be (Vin+−Vin−)×1/R1.

Detailed information about Howland's current sources can be found, e.g., in the application report AN-1515 of Texas Instruments™ titled "A Comprehensive Study of the Howland Current Source," SNOA474A—January 2008—Revised April 2013.

While the Howland current source is limited in its range of application and choice of gain, the enhanced or modified Howland current source provides a greater choice of gain and higher output currents by using the difference amplifier to impose a voltage across a shunt resistor Rs creating a current source capable of driving a wide range of load resistances. Detailed information can be found in the application report of Texas Instruments™ titled "Analysis of Improved Howland Current Pump Configurations" SBOA437—October 2020.

For electrical stimulation where multiple currents are applied between multiple pairs of electrodes, the simple current source of FIG. 1a is not applicable, and a fully differential design is required such that the current definitively flows between the desired pair of electrodes. Two Howland current sources fed in anti-phase become a suitable solution, preferentially the quad-feedback enhanced Howland current source, FIG. 1b, with a fully differential operational amplifier is utilized.

The difficulty here is that the commercially available fully differential operational amplifiers have limitations as to the maximum voltage or current that can be provided at the output or in available bandwidth. In reality, this means that rather low voltage swing is available over wider frequency ranges, severely limiting the application of integrated operational amplifiers to uses where voltages below 35 Volt are acceptable.

While it may be possible to build an operational amplifier using discrete components having higher voltage ratings, this will, next to prohibitively high cost due to component binning, most inevitably lead to lower precision, not least due to the poor thermal coupling that can be achieved for a large number of transistors in real-word designs.

SUMMARY OF THE INVENTION

It is, therefore, desirable to design a differential current buffer with wide bandwidth, high accuracy, linearity, and high output impedance that can provide high voltage output swing. It is also desirable to design a DC and alternating current source implementing the differential current buffer circuit.

This object is achieved by the differential current buffer circuit of claim 1 and the DC and alternating current source of claim 8. Advantageous embodiments and developments are described in the dependent claims.

In accordance with a first aspect of the invention, a differential current buffer circuit comprises a differential input stage that is supplied from a first positive supply voltage and a first negative supply voltage. The differential input stage has a first input circuit that is connected between a first current path of a first output current mirror, which first output current mirror is connected to a second positive supply voltage, and a first current path of a second output current mirror, which second output current mirror is connected to a second negative supply voltage. The differential input stage further has a second input circuit that is connected between a first current path of a third output current mirror, which third output current mirror is connected to the second positive supply voltage, and a first current path of a fourth output current mirror, which fourth output current mirror is connected to the second negative supply voltage. Referred to a reference potential, e.g., ground potential, the second positive supply voltage is higher than the first positive supply voltage, and the second negative supply voltage is lower than the first negative supply voltage. A first output of the differential current buffer circuit is tapped off between the respective second current paths of the first and second output current mirrors, and a second output of the differential current buffer circuit is tapped off between the respective second current paths of the third and fourth output current mirrors.

In one or more embodiments of the differential current buffer circuit, the first and the second input circuits each comprise two complementary current mirrors connected in series, and wherein the input nodes are located at a connection of the two complementary current mirrors.

In one or more embodiments of the differential current buffer circuit, the first input circuit and the second input circuit of the differential input stage are connected to a shared bias leg and form a differential translinear input cell, and the share bias leg is connected between the first positive supply voltage and the first negative supply voltage. The translinear input cell may comprise two pairs of transistors, the control electrodes of each respective pair of transistors being tied together and further being connected to an upper and lower, respectively, bias potential.

In one or more embodiments of the differential current buffer circuit, the input stage positive and negative bias current is set by a single current source coupled upstream and downstream to the first current paths of two current mirrors, the first bias current mirror being connected to the first positive supply, the second bias current mirror being connected to the first negative supply voltage. The second current paths of the bias current mirrors provide positive and negative bias currents to the input stage. The series connection of current mirrors and a single current source facilitates setting identical bias currents in the positive and negative supplies and may yield a very precise setting of the bias currents when high-precision current mirrors such as Wilson current mirrors are used.

In one or more embodiments of the differential current buffer circuit, the series-connected complementary current mirrors of the first input circuit and the second input circuit each comprises its own bias leg, i.e., each of the first and the second input circuits has one bias leg. Each bias leg is connected between the first positive supply voltage and the first negative supply voltage. The input nodes are located at the connection of the complementary current mirrors in the respective bias legs. Outputs of the complementary current mirrors are connected to the first current paths of the associated output current mirrors. The connections of the complementary current mirrors in the output current paths are tied to a reference potential, e.g., ground.

In one or more embodiments of the differential current buffer circuit, one or more of the first to fourth output current mirrors are cascode current mirrors, Wilson current mirrors, or improved Wilson current mirrors.

In accordance with a second aspect of the invention, a DC and alternating current source comprises a differential operational amplifier connected in a Howland current source configuration, whose differential outputs are connected to the inputs of the differential current buffer circuit according to the first aspect of the invention as presented hereinbefore. First feedback signals to the non-inverting and inverting inputs of the amplifier, respectively, are tapped off of load-side terminals of respective output resistors of the differential current buffer circuit.

In one or more embodiments of the DC and alternating current source, the differential operational amplifier is connected in a quad-feedback enhanced Howland current source configuration. Additional second feedback signals to the non-inverting and inverting inputs of the amplifier, respectively, are tapped off at buffer-side terminals of respective opposite output resistors of the differential current buffer circuit.

BRIEF DESCRIPTION OF THE DRAWINGS

In the following section, the invention will be described with reference to the attached drawings, in which.

In the drawings, identical or similar elements may be referenced using the same reference designator.

DETAILED DESCRIPTION OF EMBODIMENTS

Figure 1A:
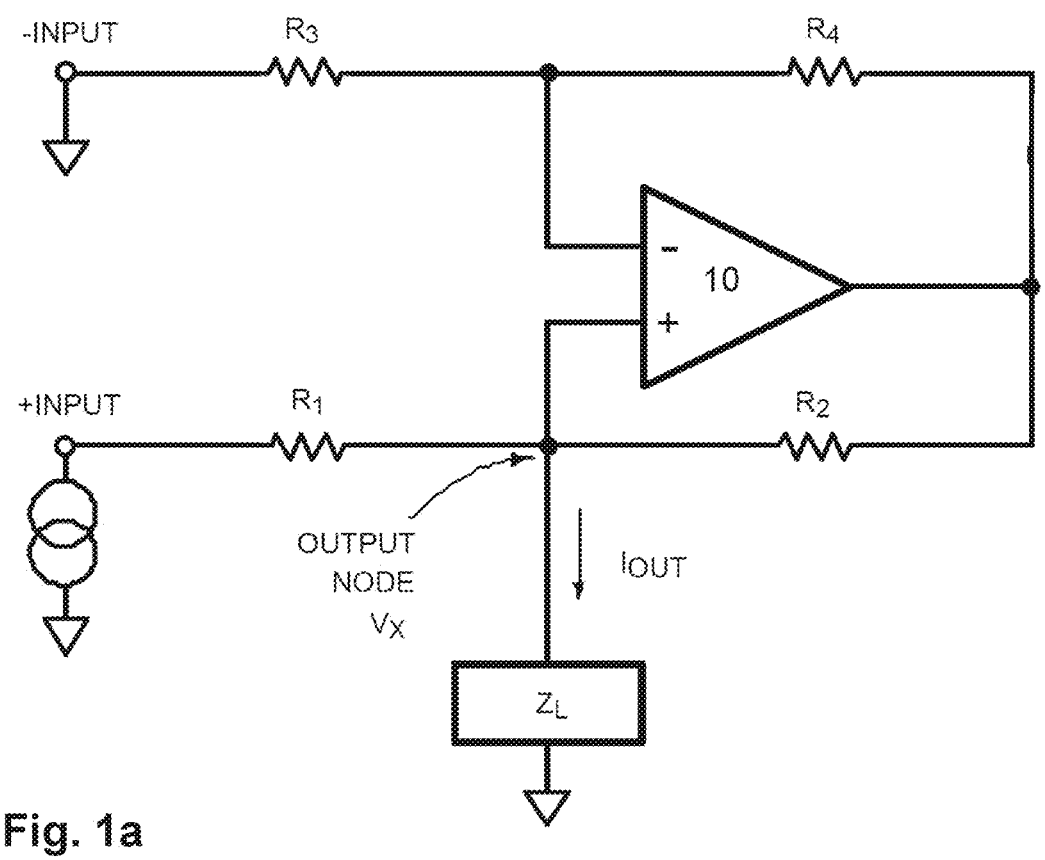
FIG. 1*a* shows a schematic circuit diagram of a known Howland current source.
Figure 1B:
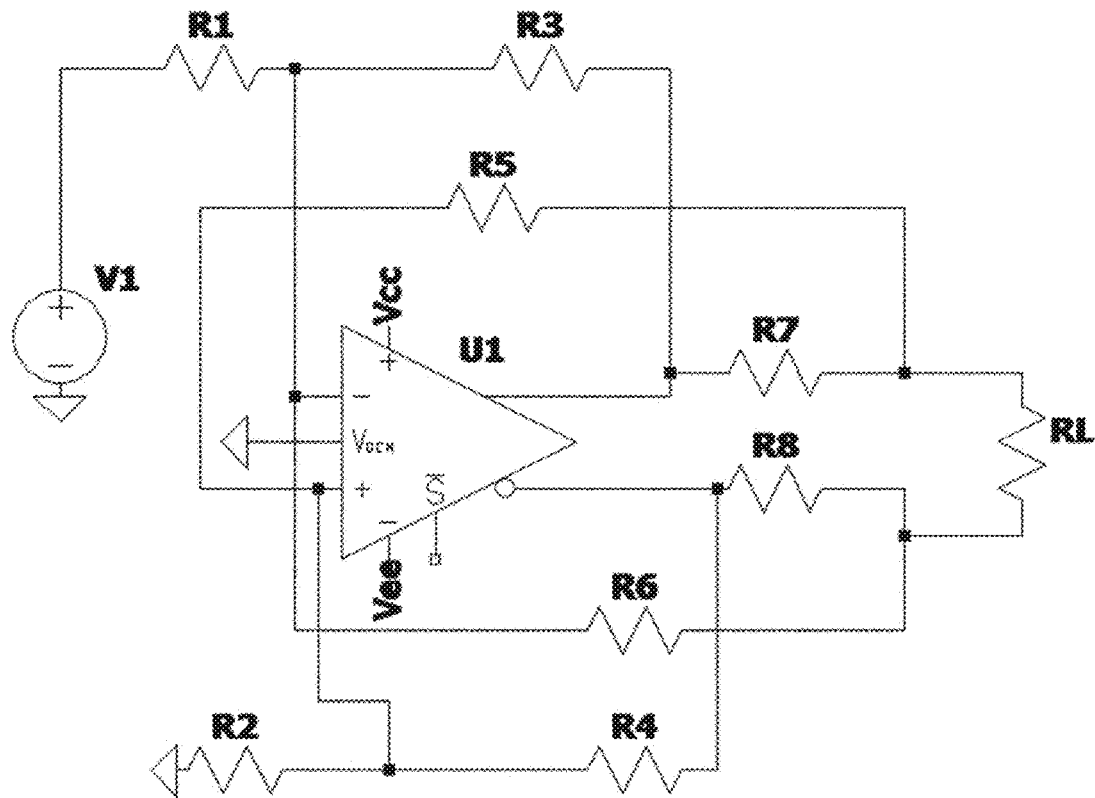
FIG. 1*b* shows a schematic circuit diagram of a known quad-feedback enhanced Howland current source.

FIGS. 1*a* and 1*b* have been described in the background section and will not be addressed again.

Figure 2:
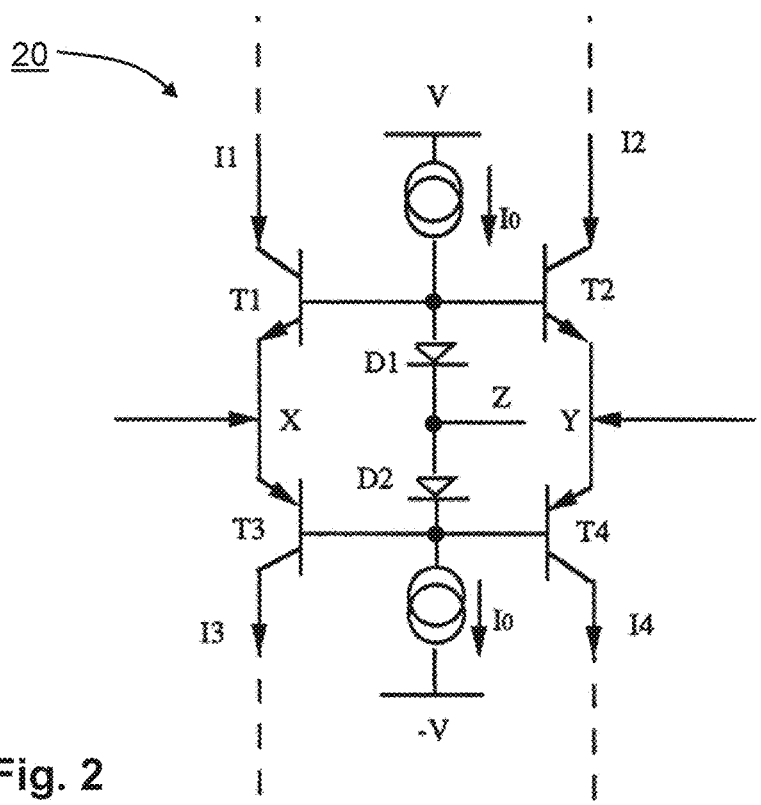
FIG. 2 shows a schematic circuit diagram of a translinear input cell.

FIG. 2 shows a schematic circuit diagram of a translinear input cell 20. The base electrodes of two pairs of transistors, T1, T2, and T3, T4, respectively, are each connected and are also connected to respective bias potentials. The bias potentials are provided from a bias leg of the translinear input cell. In the example, the bias leg comprises two current sources, each providing a current $I_o$ that are series-connected upstream and downstream, respectively, of two diodes, D1 and D2, connected in series in forward direction. Note that diode-connected transistors may also be used. The series connection is connected between a positive voltage V and a negative voltage −V. To provide a proper centering of the translinear input cell, the connection between the two diodes D1 and D2 is connected to a reference potential Z, e.g., ground.

The two pairs of transistors, T1, T2, and T3, T4, respectively, are "stacked" upon each other such that each "side" of the transistor pairs is connected, i.e., the emitter electrodes of transistors T1 and T3 are connected, and the emitter electrodes of transistors T2 and T4 are connected. Differential input signals are connected to input nodes X and Y, which are formed between the respective emitter electrode connections. Output I1 to I4 currents flow through the collector electrodes of transistors T1, T3, and T2, T4, respectively, depending on the input signals applied to the input nodes X, Y, and the further circuitry connected thereto.

Figure 3:
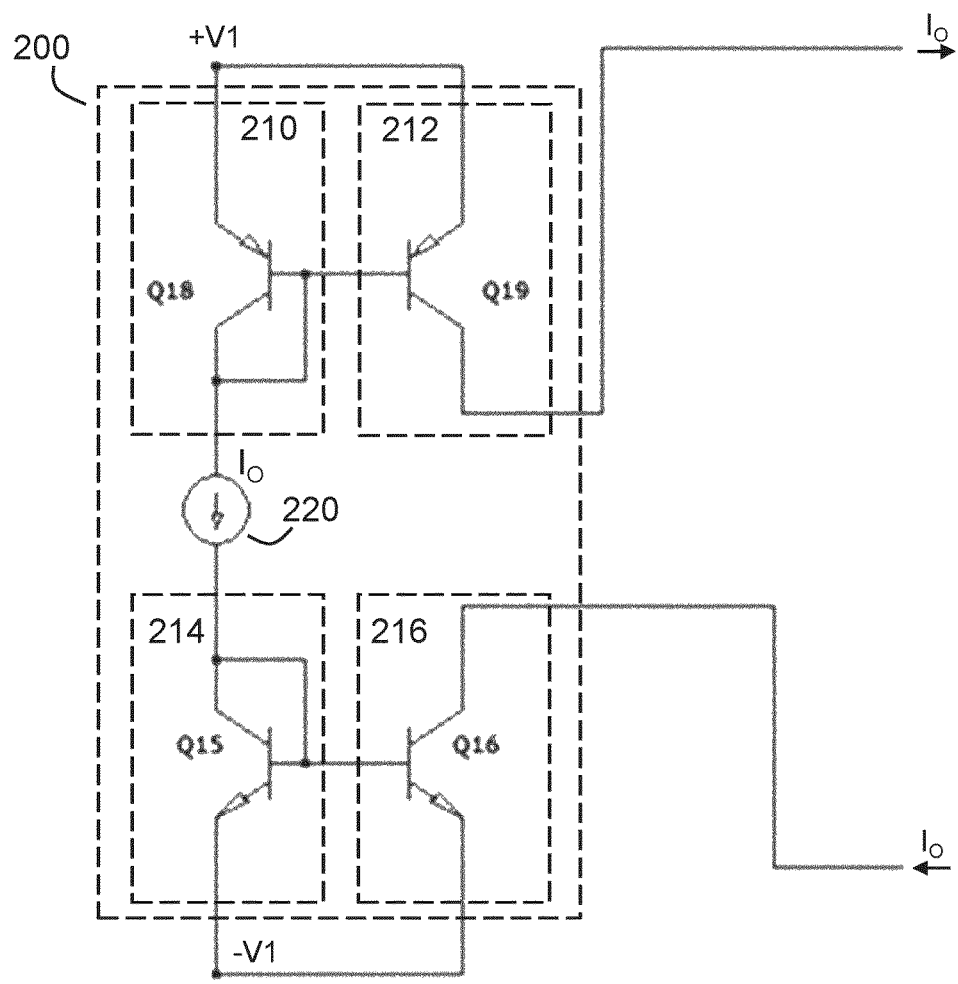
FIG. 3 shows a circuit diagram of a first exemplary differential current buffer circuit in accordance with a first aspect of the invention.
Figure 3:
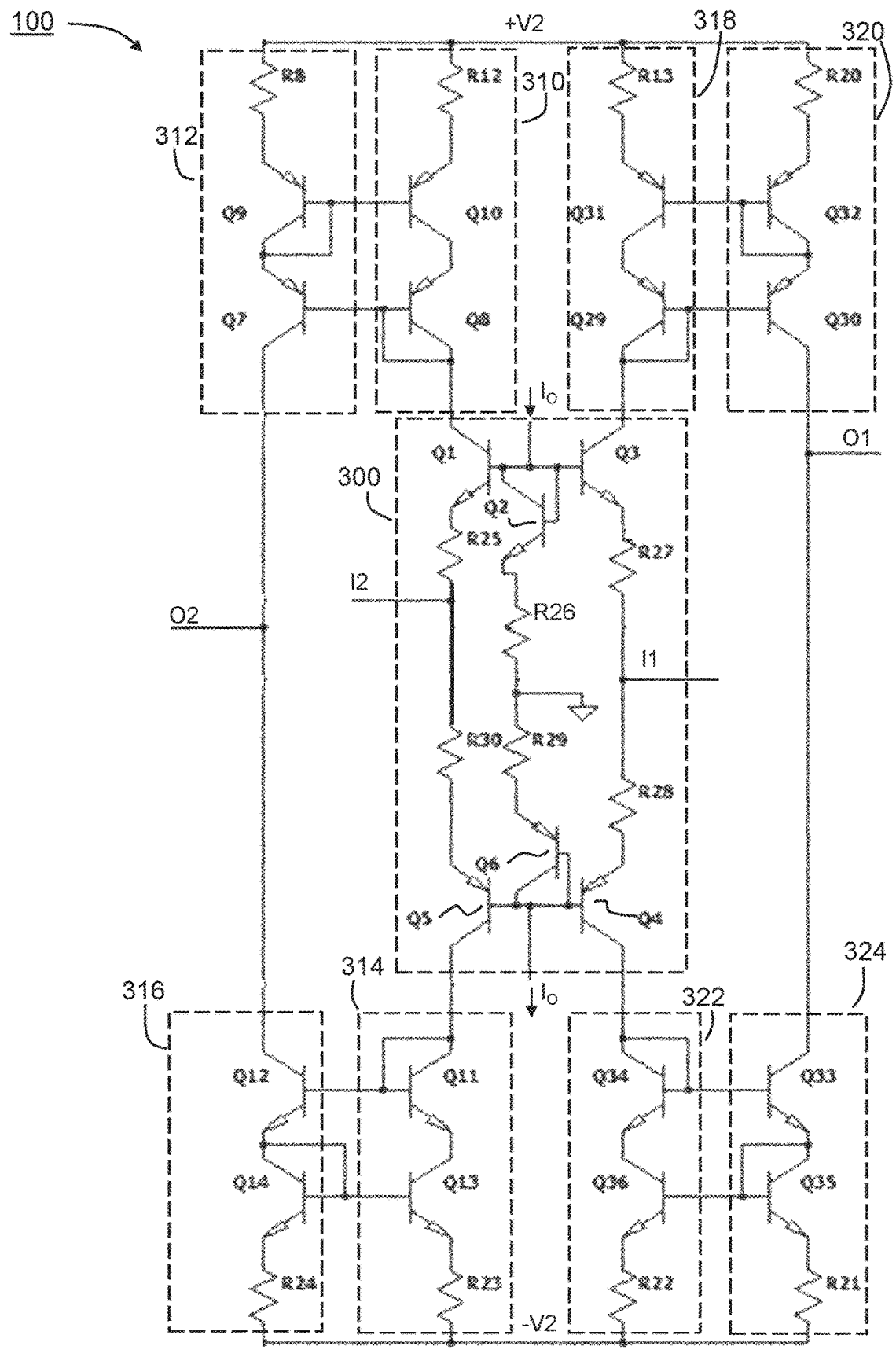

FIG. 3 shows a circuit diagram of a first exemplary differential current buffer circuit 100 in accordance with a first aspect of the invention. FIG. 3a) shows a bias power supply circuit 200, while FIG. 3b) shows an input stage 300 and the output stages of the differential current buffer circuit.

The bias power supply circuit 200 shown in FIG. 3a) comprises a first bias current mirror whose first current path 210 is connected to a first positive supply voltage +V1 and a first terminal of a current source 220. The bias power supply circuit 200 further comprises a second bias current mirror whose first current path 214 is connected between a second terminal of current source 220 and a first negative supply voltage −V1. It is to be noted that throughout this specification, the first and second positive and negative supply voltages are referred to a reference potential, e.g., ground, and are preferably symmetrical. The second current paths 212 and 216, respectively, of the first and the second bias current mirrors, form the bias current outputs, which provide power to the differential input stage 300. The bias power supply circuit 200 advantageously requires only one current source for setting the bias current, while the bias current mirrors simply copy the set current to the positive and negative supply lines.

The differential current buffer shown in FIG. 3b) has a differential input stage 300, which is similar to the translinear input cell 20 discussed with reference to FIG. 2. Different from the translinear input cell of FIG. 2, the emitters of transistors Q1, Q5, and Q3, Q4, respectively, are not directly connected but are connected through two resistors, R25, R30, and R27, R28, respectively, which are connected in series. The input nodes I1 and I2 are formed between the two respective resistors. Power to the differential input stage is provided from a first positive supply voltage +V1 and a first negative supply voltage −V1. In the present differential input circuit, power is provided to the biasing circuit from bias power supply circuit 200. The diodes D1 and D2 of the bias leg of the circuit of FIG. 2 are replaced by diode-connected transistors Q2 and Q6, which are preferably of the same type and even more preferably from the same production lot as transistors Q1, Q3, and Q4, Q5, respectively. In addition, these diodes are not directly connected to each other but are connected through two resistors, R26, R29 connected in series, which provide emitter degeneration to stabilize the operating point of the input stage in light of transistor variation thorough a corresponding setting of the bias current $I_O$ powering the differential input stage. The connection between the two resistors R26 and R29 is connected to ground for reference potential. Transistors Q3 and Q4, together with emitter degeneration resistors R27 and R28, form a first input circuit, and transistors Q1 and Q5, together with emitter degeneration resistors R25 and R30, form a second input circuit.

Outputs of the first input circuit are connected between the first current path 318 of the first output current mirror circuit connected to a second positive supply voltage+V2 and the first current path 322 of a second output current mirror circuit connected to a second negative supply voltage −V2.

Outputs of the second input circuit are connected between the first current path 310 of a third output current mirror circuit connected to a second positive supply voltage +V2 and the first current path 314 of a fourth output current mirror circuit connected to a second negative supply voltage −V2.

A first output O1 of the differential buffer circuit 100 is tapped off between the respective second current paths 320, 324 of the first and second output current mirrors, which are tied together and which are powered by the second positive supply voltage +V2 and the second negative supply voltage −V1, respectively.

A second output O2 of the differential buffer circuit 100 is tapped off between the respective second current paths 312, 316 of the third and fourth output current mirrors, which are tied together and which are powered by the second positive supply voltage +V2 and the second negative supply voltage −V1, respectively.

The first and the second input circuit each form complementary current mirrors connected in series, which have a shared bias leg, and whose respective output current is controlled by a current applied to the respective input node I1 or I2. The input current modifies the respective currents through each of the complementary current mirrors, which are connected to the first current paths of the associated output current mirrors. The currents through the first current paths of the output current mirrors are matched in the respective second paths of the output current mirrors and are available at a corresponding output O1 and O2, respectively.

Figure 4:
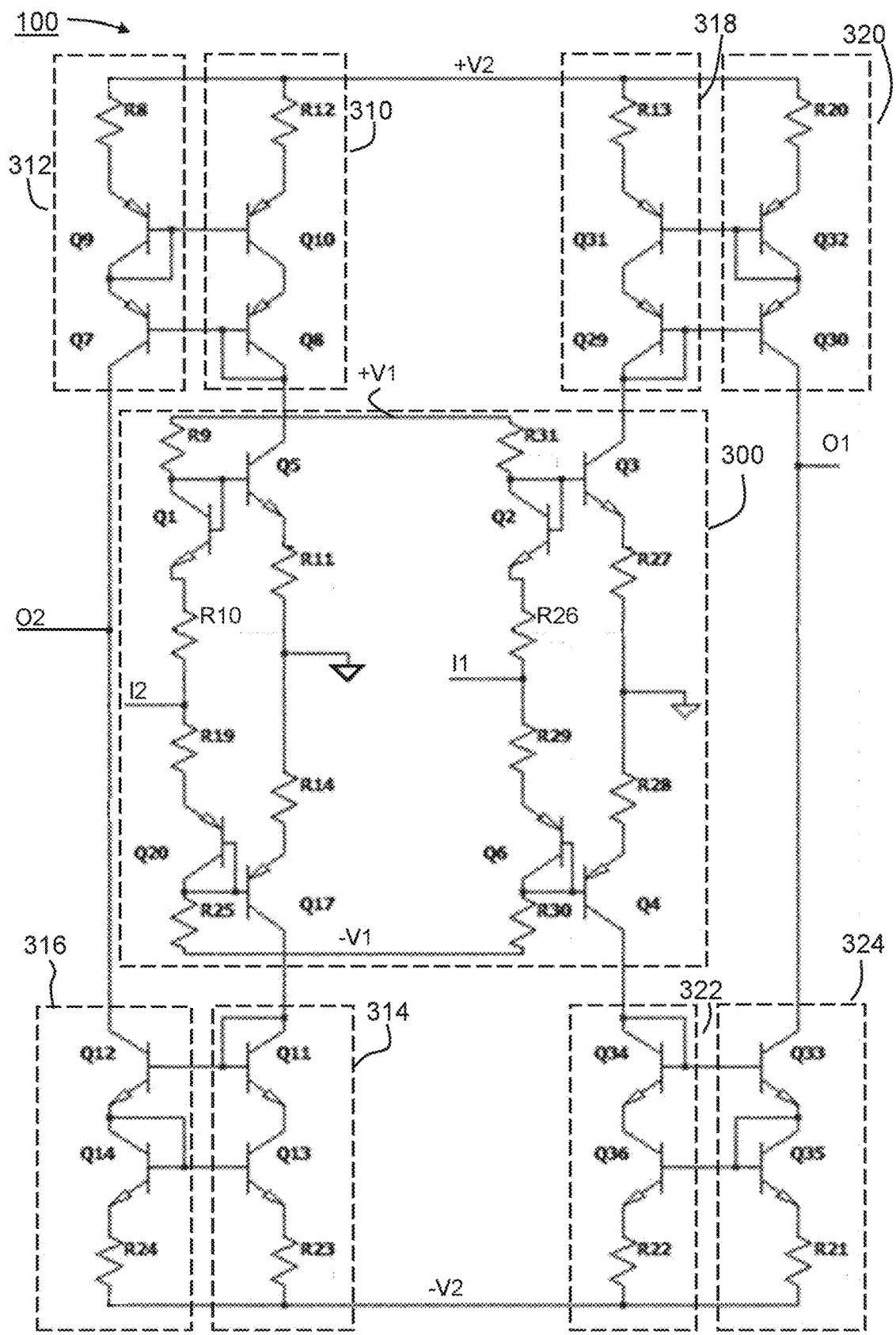
FIG. 4 shows a circuit diagram of a second exemplary differential current buffer circuit in accordance with a first aspect of the invention.

FIG. 4 shows a circuit diagram of a second exemplary differential current buffer circuit in accordance with the first aspect of the invention. The output stages of the differential current buffer circuit correspond to those described with reference to FIG. 3b). The input stage 300 is of a different design. Here, an individual bias leg of each input circuit of the input stage 300 is directly powered from the first positive and negative supply voltages +V1, −V1, respectively.

The first input circuit, comprising transistors Q2, Q3, Q4, and Q6 and resistors R26, R27, R28, R29, R30, and R31, has its input node in the bias leg, more particularly in the center point of the series connection of resistors R26 and R29 that connect diode-connected transistors Q2 and Q6. The "anode" of diode-connected transistor Q2 is connected to the first positive supply voltage +V1 through resistor R31, and the "cathode" of diode-connected transistor Q6 is connected to the first negative supply voltage −V1 through resistor R30. Resistors R26, R29, R30, and R31 will set the bias current in the bias leg of the first input circuit. The ratio of R31/R26 and R30/R29 will set the gain of the current buffer, and R30=R31 and R26=R27=R28=R29 for correct operation.

Outputs of the first input circuit are connected between a first current path 318 of a first output current mirror circuit connected to a second positive supply voltage +V2 and a first current path 322 of a second output current mirror circuit connected to a second negative supply voltage −V2.

The outputs of the first input circuit are formed by the collector electrodes of transistors Q3 and Q4, respectively, whose emitter electrodes are connected to a reference potential, here: ground, through resistors R27 and R28, respectively.

The second input circuit, comprising transistors Q1, Q5, Q17, and Q20 and resistors R9, R10, R11, R14, R19, and R25, likewise has its input node in the bias leg, more particularly in the center point of the series connection of resistors R10 and R19 that connect diode-connected transistors Q1 and Q20. The "anode" of diode-connected transistor Q1 is connected to the first positive supply voltage +V1 through resistor R9, and the "cathode" of diode-connected transistor Q20 is connected to the first negative supply voltage −V1 through resistor R25. Resistors R9, R10, R19, and R25 will set the bias current in the bias leg of the second input circuit. The ratio of R25/R19 and R9/R10 will set the gain of the current buffer, and R9=R25 and R10=R11=R14=R19 for correct operation.

Outputs of the second input circuit are connected between a first current path 310 of a third output current mirror circuit connected to a second positive supply voltage +V2 and a first current path 314 of a fourth output current mirror circuit connected to a second negative supply voltage −V2. The outputs of the second input circuit are formed by the collector electrodes of transistors Q5 and Q17, respectively, whose emitter electrodes are connected to a reference potential, here: ground, through resistors R11 and R148, respectively.

The first and second input circuit each form complementary current mirrors connected in series, whose respective output current is controlled by a voltage applied to the respective input node I1 or I2. The input voltage modifies the respective currents through each of the complementary current mirrors, which are connected to the first current paths of the associated output current mirrors. The currents through the first current paths of the output current mirrors are copied in the respective second paths of the output current mirrors and are available at a corresponding output O1 and O2, respectively.

Like in the differential buffer circuit 100 discussed with reference to FIG. 3, a first output O1 of the differential buffer circuit 100 is tapped off between the respective second current paths 320, 324 of the first and second output current mirrors, which are tied together and which are powered by the second positive supply voltage +V2 and the second negative supply voltage −V1, respectively. A second output O2 of the differential buffer circuit 100 is tapped off between the respective second current paths 312, 316 of the third and fourth output current mirrors, which are tied together and which are powered by the second positive supply voltage +V2 and the second negative supply voltage −V1, respectively.

Figure 5:
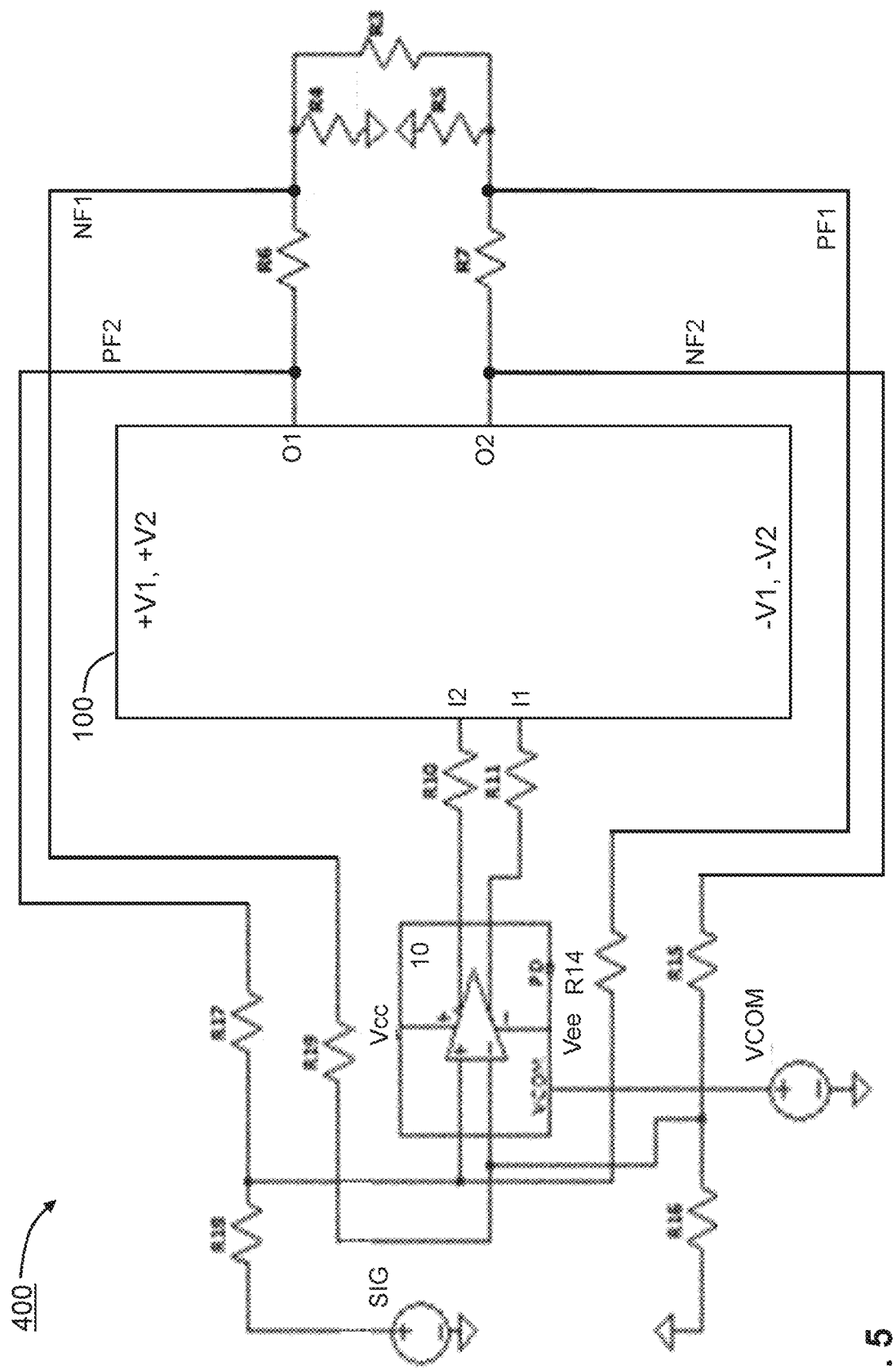
FIG. 5 shows a circuit diagram of a DC and alternating current source comprising the first exemplary differential current buffer circuit of FIG. 3 connected to an operational amplifier in a quad-feedback enhanced Howland current source circuit arrangement.

FIG. 5 shows a circuit diagram of a DC and alternating current source 400 comprising the first exemplary differential current buffer circuit 100 of FIG. 3 connected to a fully differential operational amplifier 10 in a quad-feedback enhanced Howland current source circuit arrangement. The differential current buffer circuit 100 comprises a bias power supply circuit 200, as shown in FIG. 3a) and the actual buffer circuit shown in FIG. 3b).

The first output O1 of the differential current buffer circuit 100 is connected to a load, represented by R3, via an output resistor R6, which serves as a current sensing resistor. The second output O2 of the differential current buffer circuit 100 is connected to the load via an output resistor R7, which serves as a current sensing resistor.

A first negative feedback signal NF1 is tapped off between the load R3 and load-side terminals of output resistor R6. The first negative feedback signal NF1 is fed to the inverting input of operational amplifier 10 via resistor R19. A first positive feedback signal PF1 is tapped off between the load R3 and load-side terminals of output resistor R7. The first positive feedback signal PF1 is fed to the non-inverting input of operational amplifier 10 via resistor R14.

A second negative feedback signal NF2 is tapped off between the second output O2 of the differential current buffer circuit 100 and a buffer-side terminal of output resistor R7. The second negative feedback signal NF2 is fed to the inverting input of operational amplifier 10 via a voltage divider to ground comprising resistors R15 and R16. A second positive feedback signal PF2 is tapped off between the first output O1 of the differential current buffer circuit 100 and a buffer-side terminal of output resistor R6. The second positive feedback signal PF2 is fed to the non-inverting input of operational amplifier 10 via a voltage divider comprising resistors R17 and R18 to a signal source SIG. Signal source SIG is referenced to ground and, being a voltage source, represents a ground connection for the second positive feedback signal PF2.

Operational amplifier 10 may be powered from positive and negative supply voltages Vcc and Vee, respectively, which may be independent from the first supply voltages +V1 and −V1. Common mode offsets at the output may be trimmed using a corresponding trim voltage VCOM at a corresponding input of operational amplifier 10.

Resistors R10 and R11 between the outputs of operational amplifier 10 and the first input I1 and the second input I2, respectively, of the differential current buffer circuit 100 may be required for stability. However, they may require a higher output swing from the operational amplifier 10 to produce the required input current to the inputs I1 and I2 of the differential current buffer circuit 100. These resistors may need to be properly selected for optimal step response and minimal ringing or overshoot, i.e., resistors having a low parasitic inductance may be preferred.

Resistors R4 and R5 connected to ground provide a path to ground across the load R3, effectively being parts of voltage dividers that permit monitoring the output voltage. However, resistors R4 and R5 also limit the maximum output impedance of the current source 400 to the sum of the values of resistors R4 and R5. The frequency response of the current source will be limited by the input capacitance of operational amplifier 10, which will typically be a few pF only.

Closing the quad-feedback loop around the entire circuit, as shown in the figure, ensures the lowest possible distortion of the output signal applied to the load.

Figure 6:
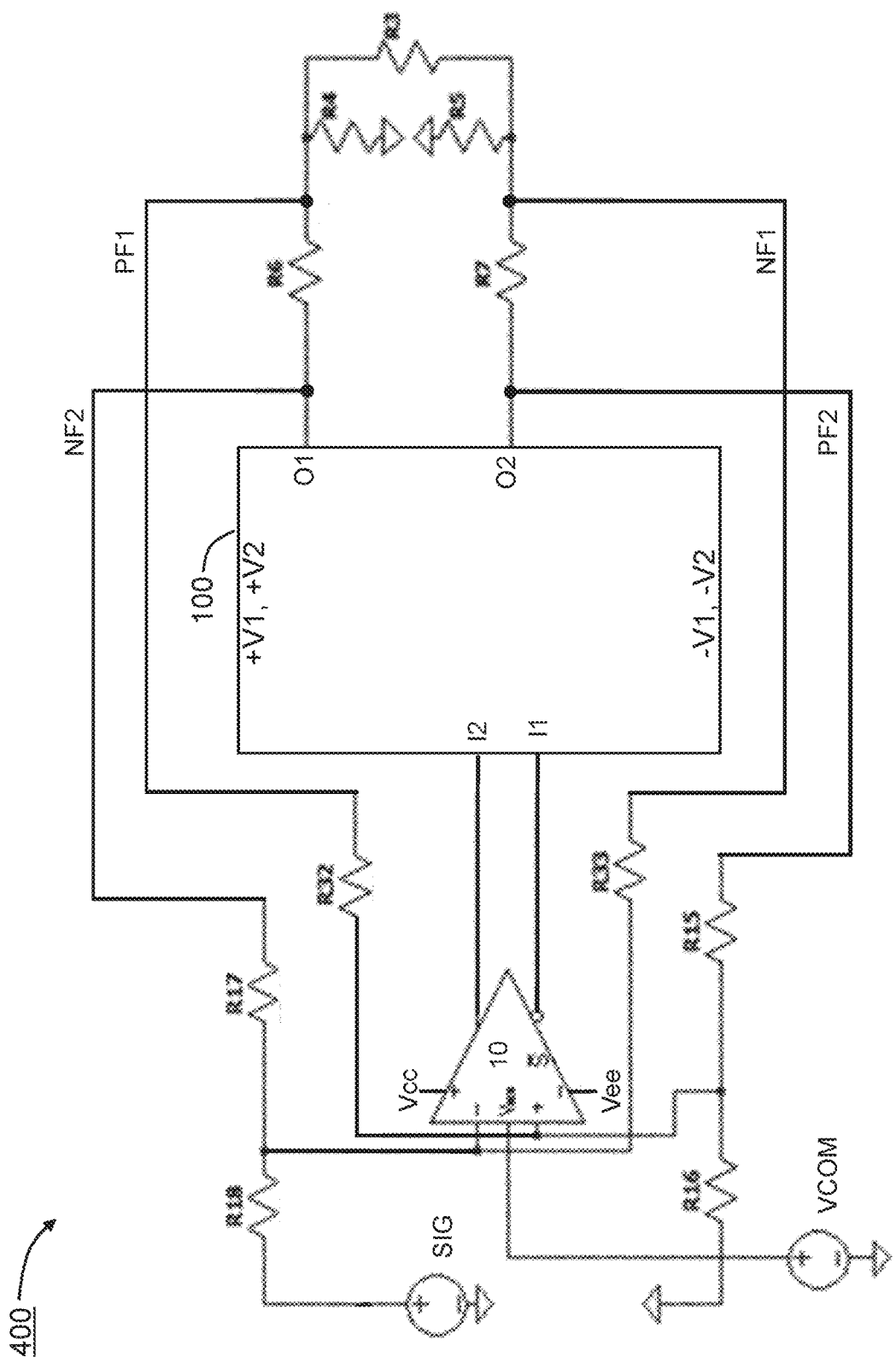
FIG. 6 shows a circuit diagram of a DC and alternating current source comprising the second exemplary differential current buffer circuit of FIG. 4 connected to an operational amplifier in a quad-feedback enhanced Howland current source circuit arrangement.

FIG. 6 shows a circuit diagram of an DC and alternating current source 400 comprising the second exemplary differential current buffer circuit 100 of FIG. 4 connected to an operational amplifier in a quad-feedback enhanced Howland current source circuit arrangement.

Like in the DC and AC current source of FIG. 5, feedback is applied around the whole circuit. R6 and R7 are the current sensing resistors, and the quad-feedback goes back to the input of the fully differential operational amplifier 10 drive stage. Again, applying feedback around the entire circuit ensures the lowest possible distortion.

Different from the circuit of FIG. 5, in this circuit, there are no resistors at the output of the operational amplifier as the differential buffer requires a voltage drive. Any output common-mode offset voltages can be trimmed using the VCOM input to the operational amplifier 10.

Resistors R4 and R5 connected to ground, like in the circuit of FIG. 5, provide a path to ground across the load R3, effectively being parts of voltage dividers that permits monitoring the output voltage. Likewise, resistors R4 and R5 also limit the maximum output impedance of the DC and alternating current source 400 to the sum of the values of resistors R4 and R5. The frequency response of the current source will be limited by the input capacitance of operational amplifier 10, which will typically be a few pF only. The output DC offset is controlled using the VCOM input to the fully differential operational amplifier 10.

For the highest accuracy, the differential current buffer circuit 100 is preferably operated in class-A mode, which can be achieved by properly adjusting the respective bias currents.

In this circuit, the first positive and negative supply voltages +V1, −V1 of the differential current buffer circuit 100 are the same supply voltages Vcc and Vee, respectively, that power operational amplifier 10.

As shown in FIGS. 3 and 4, the output current mirrors may be implemented as cascode current mirrors. Due to the finite output resistance of the transistors, simple current mirrors exhibit a dependency of the output current from the output voltage. Cascode current mirrors may significantly reduce this dependency.

LIST OF REFERENCE NUMERALS (PART OF THE DESCRIPTION)

10 operational amplifier
20 translinear input cell
100 differential current buffer
200 bias power supply
210 first current path of first bias current mirror
212 second current path of first bias current mirror
214 first current path of second bias current mirror
216 second current path of second bias current mirror
300 differential input stage
318 first current path of first output current mirror
320 second current path of first output current mirror
322 first current path of second output current mirror
324 second current path of second output current mirror
310 first current path of third output current mirror
312 second current path of third output current mirror
314 first current path of fourth output current mirror
316 second current path of fourth output current mirror
400 alternating current source
D1, D2 Diodes
I1-I4 output currents
$I_O$ bias current
I1 first input
I2 second input
NF1 first negative feedback signal
NF2 second negative feedback signal
O1 first output
O2 second output
PF1 first positive feedback signal
PF2 second positive feedback signal
Q1-Q36 transistors
R1-R30 resistors
SIG signal source
T1-T4 transistors
+V1 first positive supply voltage
+V2 second positive supply voltage
−V1 first negative supply voltage
−V2 second negative supply voltage
Vcc operation amplifier positive supply voltage
VCOM common-mode trim
Vee operation amplifier negative supply voltage
$V_X$ output node
X, Y input nodes
Z reference potential
$Z_L$ load

The invention claimed is:

1. A differential current buffer circuit comprising:
a differential input stage that is powered from a first low-impedance positive supply voltage source and a first low-impedance negative supply voltage source, the differential input stage having
 a first input circuit whose outputs are connected between a first current path of a first output current mirror connected to a second low-impedance positive supply voltage source and a first current path of a second output current mirror connected to a second low-impedance negative supply voltage source, and
 a second input circuit whose outputs are connected between a first current path of a third output current mirror connected to the second low-impedance positive supply voltage source and a first current path of a fourth output current mirror connected to the second low-impedance negative supply voltage source,
wherein, referred to a reference potential, a second low-impedance positive supply voltage from the second low-impedance positive supply voltage source is higher than a first low-impedance positive supply voltage from the first low-impedance positive supply voltage source and a second low-impedance negative supply voltage from the second low-impedance negative supply voltage source is lower than a first low-impedance negative supply voltage from the first low-impedance negative supply voltage source,
wherein a first output of the differential current buffer circuit is tapped off between the respective second current paths of the first and second output current mirrors, and
wherein a second output of the differential current buffer circuit is tapped off between the respective second current paths of the third and fourth output current mirrors.

2. The differential current buffer circuit according to claim 1, wherein the first and the second input circuit each comprise a emitter push-pull follower, the push-pull emitter followers of the first and second input circuit being connected back-to-back, and
wherein the input nodes are disposed at a center connection of the respective push-pull emitter follower.

3. The differential current buffer circuit according to claim 2, wherein the first input circuit and the second input circuit of the differential input stage are connected to a shared bias leg and form a differential translinear input cell, and
wherein the shared bias leg is powered from the first low-impedance positive supply voltage source and the first low-impedance negative supply voltage source.

4. The differential current buffer circuit according to claim 3, wherein the shared bias leg is connected to the first low-impedance positive supply voltage source via a first bias current source and to the first low-impedance negative supply voltage source via a second bias current source.

5. The differential current buffer circuit according to claim 4, wherein the first bias current source corresponds to a second current path of a first bias current mirror and the second bias current source corresponds to a second current path of a second bias current mirror, and wherein the input stage bias current is set by a current source coupled upstream and downstream, respectively, to first current paths of the first and the second bias current mirrors.

6. The differential current buffer circuit according to claim 2, wherein the series-connected complementary current mirrors of the first input circuit and the second input circuit each comprise its own bias leg, wherein each bias leg is connected between the first low-impedance positive supply voltage source and the first low-impedance negative supply voltage source, wherein the input nodes are located at the connection of the complementary current mirrors in the respective bias legs, wherein outputs of the complementary current mirrors are connected to first current paths of the associated output current mirrors, and wherein the connections of the complementary current mirrors in the output current paths are tied to a reference potential.

7. The differential current buffer circuit according to claim 1, wherein the output current mirrors are one of cascode current mirrors, Wilson current mirrors, and improved Wilson current mirrors using bipolar or field-effect transistors.

8. A DC and alternating current source comprising:
a differential operational amplifier connected in a differential Howland current source configuration, whose differential outputs are connected to the corresponding input nodes of the differential current buffer circuit according to claim 1, wherein first feedback signals to the non-inverting and inverting inputs of the amplifier, respectively, are tapped off the load-side terminals of respective output resistors connected between the outputs of the differential current buffer circuit and the load, the load-side terminals representing the actual output of the alternating current source.

9. The DC and alternating current source according to claim 8, wherein the differential operational amplifier is connected in a quad-feedback enhanced Howland current source configuration, wherein additional second feedback signals to the non-inverting and inverting inputs of the operational amplifier, respectively, are tapped off at buffer-side terminals of the respective opposing output resistor.

* * * * *